(12) United States Patent
Tanabe

(10) Patent No.: US 7,507,033 B2
(45) Date of Patent: Mar. 24, 2009

(54) OPTICAL PICKUP AND OPTICAL DISK APPARATUS INCORPORATING THE SAME

(75) Inventor: Noritaka Tanabe, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 11/338,694

(22) Filed: Jan. 25, 2006

(65) Prior Publication Data

US 2006/0171655 A1 Aug. 3, 2006

(30) Foreign Application Priority Data

Feb. 2, 2005 (JP) ............................. 2005-025960

(51) Int. Cl.
G02B 6/36 (2006.01)
H01S 3/04 (2006.01)
(52) U.S. Cl. .......................................... 385/88; 372/36
(58) Field of Classification Search ................. 385/147
See application file for complete search history.

(56) References Cited

U.S. PATENT DOCUMENTS 4,393,393 A * 7/1983 Allen et al. .................... 372/36
6,331,111 B1 * 12/2001 Cao .............................. 433/29
6,707,073 B1    3/2004 Yamamoto et al. ........... 257/99
6,712,527 B1 *  3/2004 Chan et al. ..................... 385/88
2004/0168177 A1 *  8/2004 Tanaka et al. ............... 720/672
2004/0218501 A1   11/2004 Sogawa et al.

FOREIGN PATENT DOCUMENTS

| EP | 1 282 206 A1 | 2/2003 |
| EP | 1 408 489 A2 | 4/2004 |
| JP | 2002-150589 | 5/2002 |
| JP | 2003-187477 | 7/2003 |
| JP | A-2003-187479 | 7/2003 |
| JP | A-2003-272208 | 9/2003 |
| JP | 2004-355754 | 12/2004 |

* cited by examiner

*Primary Examiner*—Uyen Chau N Le
*Assistant Examiner*—Hoang Tran
(74) *Attorney, Agent, or Firm*—Morgan Lewis & Bockius LLP

(57) ABSTRACT

An optical pickup is so constructed as to have an LD (Laser Diode), an LD plate for fixing the LD, and a base to which the LD and the LD plate are mounted, and a heat dissipation plate made of sheet metal is provided so as to be kept in contact with the LD.

6 Claims, 6 Drawing Sheets

OPTICAL PICKUP AND OPTICAL DISK APPARATUS INCORPORATING THE SAME

This application is based on Japanese Patent Application No. 2005-025960 filed on Feb. 2, 2005, the contents of which are hereby incorporated by reference.

BACKGROUND OF THE INVENTION

1. Field of the Invention

The present invention relates to an optical pickup and an optical disk apparatus incorporating the same, and more specifically, to a heat dissipating structure of a laser diode used for the optical pickup.

2. Description of the Prior Art

An optical pickup is used for recording and reading optical disks such as CD (Compact Disk) and DVD (Digital Versatile Disk). FIG. 5 is an exploded perspective view of a conventional optical pickup. An optical pickup 100 has a base 101, an LD (Laser Diode) 102, an LD holder 103, an LD plate 104, a collimator lens 105, a half mirror 106, an upward-directed mirror 107, an FPC (Flexible Printed Circuit) 108, and a PDIC (Photo Detector IC) 109.

FIG. 6A is a cross sectional view showing an essential portion of FIG. 5. FIG. 6B is a bottom view of FIG. 6A. The LD 102 is fitted to the LD holder 103, and the LD holder 103, the LD plate 104, and the base 101 are fixed together. Although they are fixed with screws as shown in FIG. 5, it is also possible to fix them together with an adhesive or the like. In this example, the LD holder is produced through metal forming such as zinc die casting, and the base 101 is made of resin such as PPS. The LD holder 103 is made of metal so as to improve heat dissipation. Furthermore, the base 101 is made of resin, because it has a complicated shape and the resin is inexpensive and easy to process.

Japanese Patent Application Laid-Open No. 2003-187479 also discloses an optical head apparatus that employs a device holder such as the aforementioned LD holder.

Japanese Patent Application Laid-Open No. 2003-272208 discloses an optical pickup having a heat conductive resin interposed between a semiconductor laser and a contiguous portion adjacent thereto. Here, the heat conductive resin is used to fill a gap therebetween and facilitate heat dissipation.

According to the structure shown in FIG. 5 and the structure disclosed in Japanese Patent Application Laid-Open No. 2003-187479, since an LD holder (a device holder in Japanese Patent Application Laid-Open No. 2003-187479) is used, it helps dissipate heat. This, however, leads to an increased component cost. On the other hand, if the LD, without the LD holder, is directly fitted to the base for the purpose of decreasing the cost, the heat dissipation suffers, and this will result in harming the performance of the LD.

As disclosed in Japanese Patent Application Laid-Open No. 2003-187479, if a heat conductive resin is used, it is less expensive but offers poor performance in heat dissipation than the LD holder.

SUMMARY OF THE INVENTION

It is an object of the invention to provide an optical pickup reduced in component cost while heat dissipation performance is maintained. It is also an object of the invention to provide an optical disk apparatus incorporating such an optical pickup.

To achieve the above object, according to one aspect of the present invention, in an optical pickup having an LD (Laser Diode), an LD plate for fixing the LD, and a base to which the LD and the LD plate are mounted, a heat dissipation plate made of sheet metal is provided so as to be kept in contact with the LD.

With this structure, heat generated by the LD is conducted to the heat dissipation plate and released therefrom.

It is desirable that the heat dissipation plate have an inner circumferential face that is kept in contact with an outer circumference of the LD so that a larger contact area is realized for improved heat dissipation.

According to another aspect of the invention, the heat dissipation plate is interposed between the LD plate and the base.

With this structure, the heat conducted to the heat dissipation plate is further conducted to the LD plate, thus improving the heat dissipation efficiency.

It is further desirable that the inner circumferential face of the heat dissipation plate be a bent face that is kept in contact with the outer circumference of the LD so that a larger contact area is realized for improved heat dissipation.

According to still another aspect of the invention, an optical disk apparatus incorporates the aforementioned optical pickup.

According to still another aspect of the invention, by replacing a conventional LD holder which is produced through metal forming with the heat dissipation plate which is a component made of sheet metal, it is possible to reduce the component cost through easy forming procedure using a smaller amount of inexpensive material. Furthermore, because the contact portions of the heat dissipation plate come into contact with the outer circumference of the LD, the contact area is made larger. This, combined with using a good heat conductive material, makes it possible to maintain the heat dissipation performance.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENT

Figure 1A:
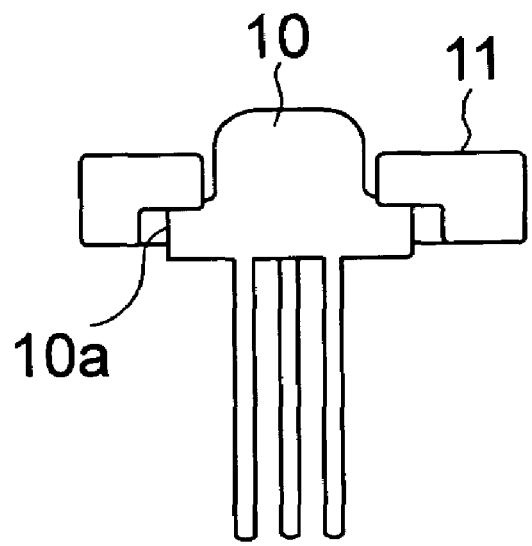
FIG. 1A is a cross sectional view of an LD and a base.
Figure 1B:
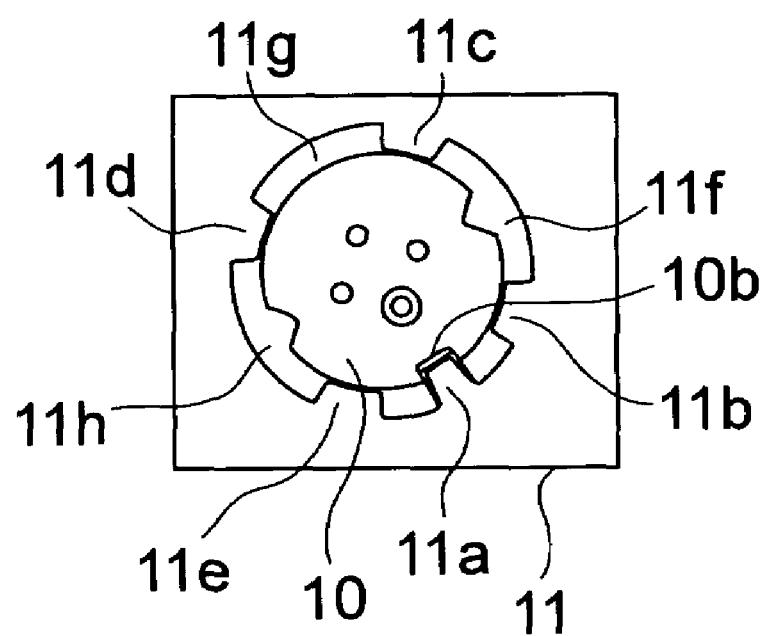
FIG. 1B is a bottom view of FIG. 1A.
Figure 2A:
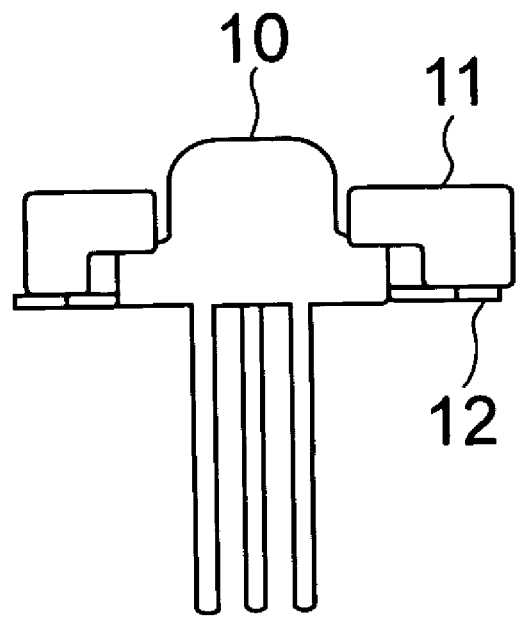
FIG. 2A is a cross sectional view of an LD, a base, and a heat dissipation plate used in a first example of the embodiment.
Figure 2B:
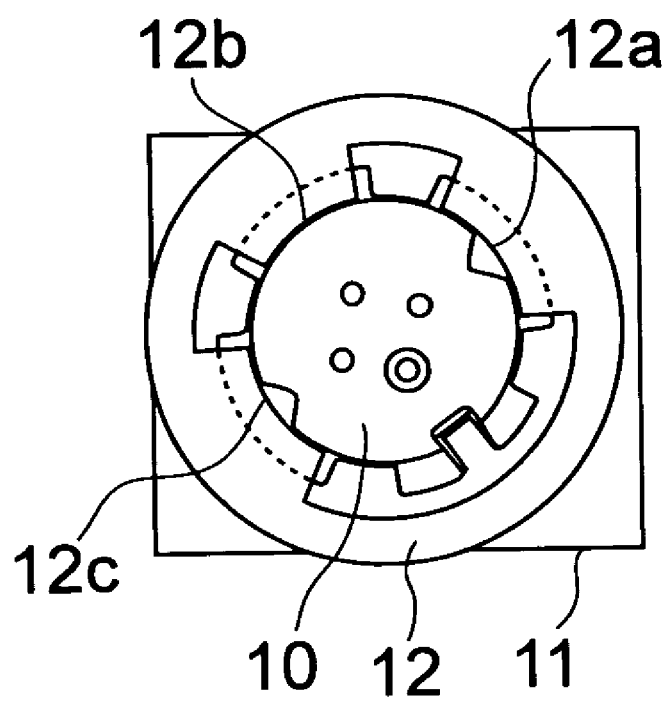
FIG. 2B is a bottom view of FIG. 2A.
Figure 3A:
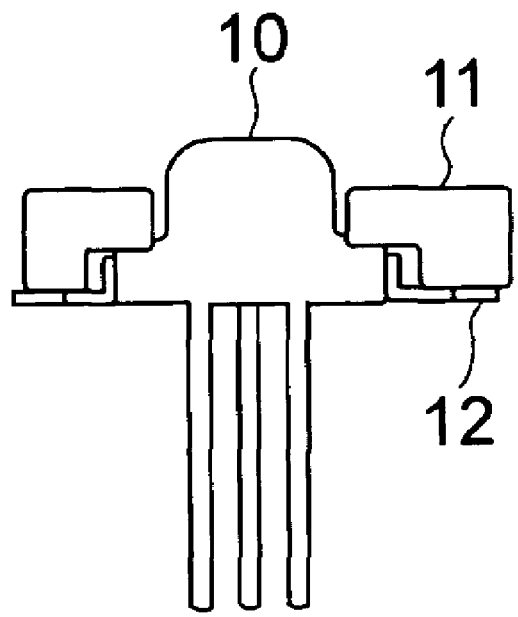
FIG. 3A is a cross sectional view of an LD, a base, and a heat dissipation plate used in a second example of the embodiment.
Figure 3B:
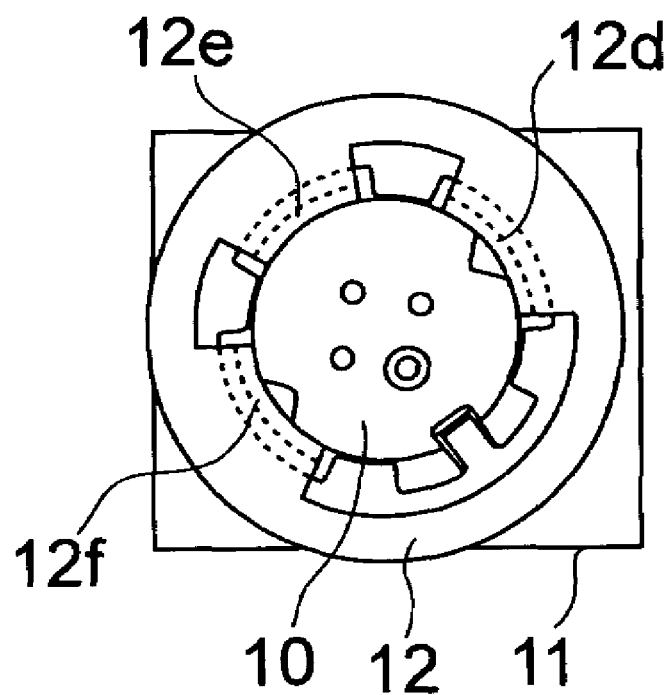
FIG. 3B is a bottom view of FIG. 3A.
Figure 4A:
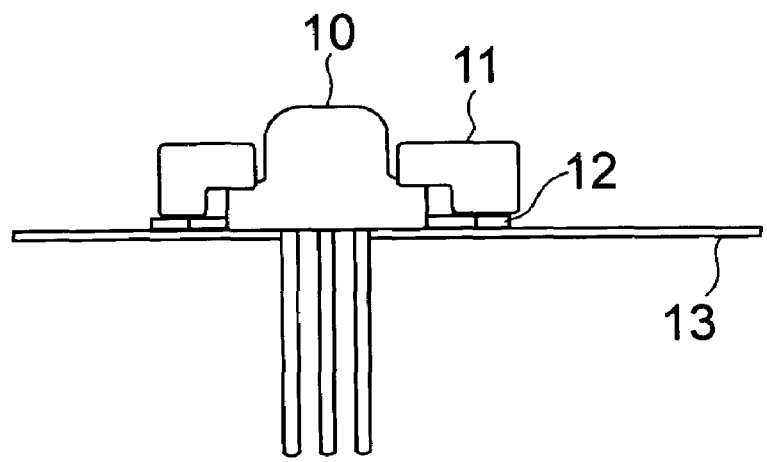
FIG. 4A is a cross sectional view of the LD, the base, the heat dissipation plate, and an LD plate used in the first example of the embodiment.
Figure 4B:
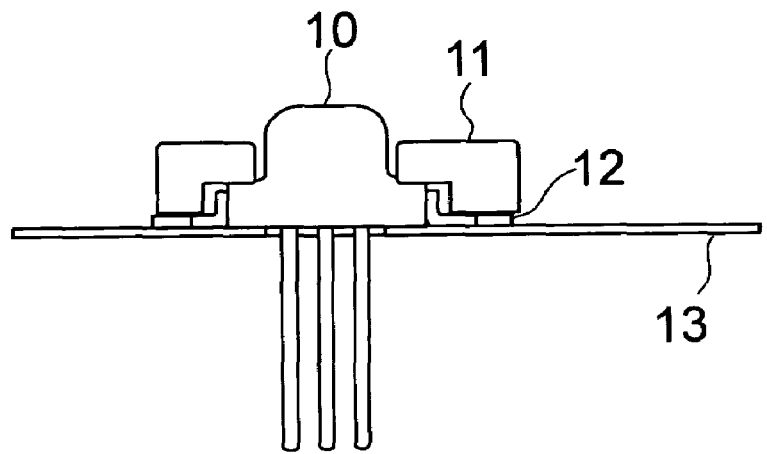
FIG. 4B is a cross sectional view of the LD, the base, the heat dissipation plate, and an LD plate used in the second example of the embodiment.
Figure 4C:
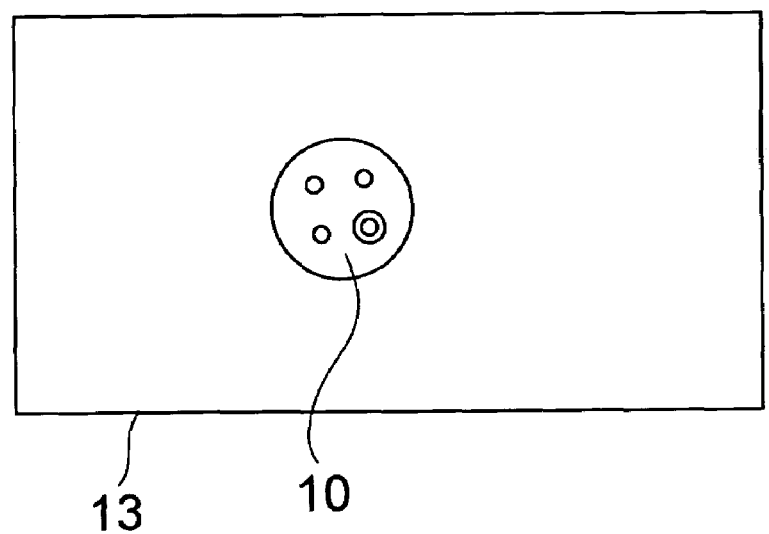
FIG. 4C is a bottom view of FIG. 4A or FIG. 4B.
Figure 5:
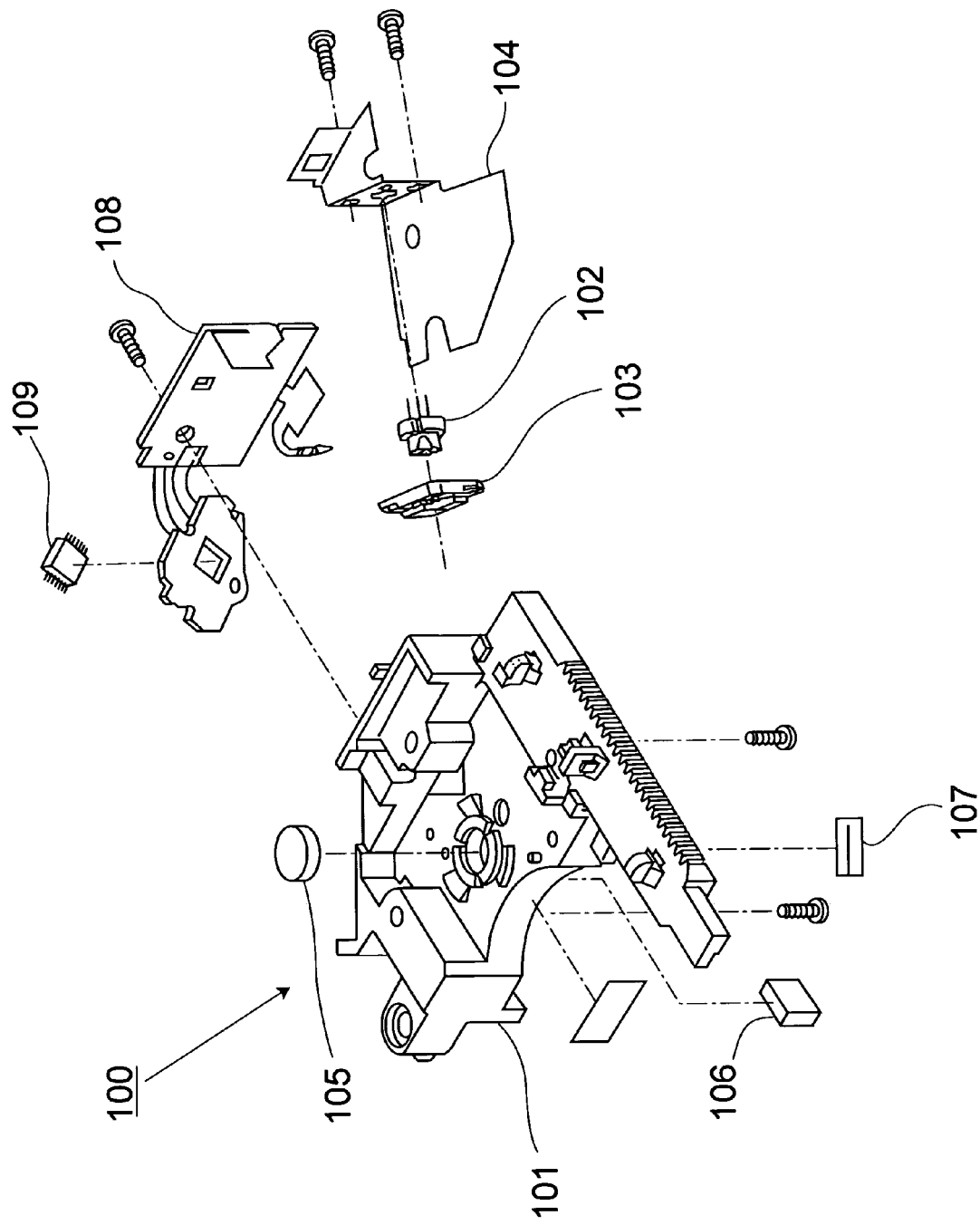
FIG. 5 is an exploded perspective view of a conventional optical pickup.
Figure 6A:
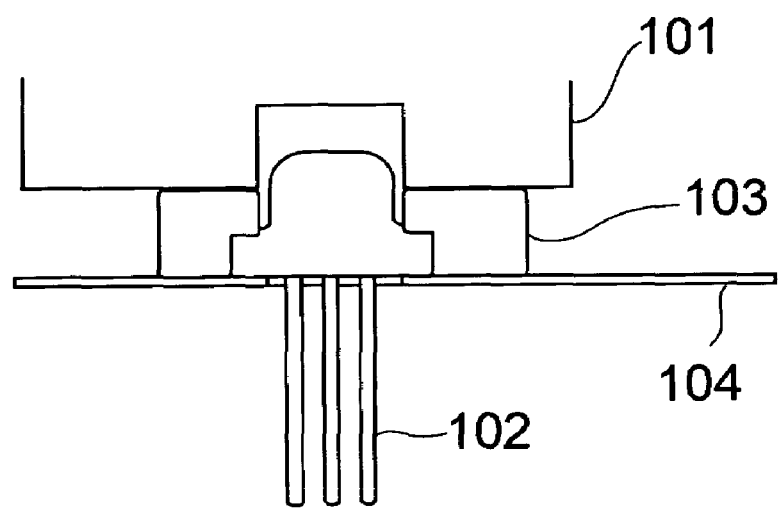
FIG. 6A is a cross sectional view showing an essential portion of FIG. 5.
Figure 6B:
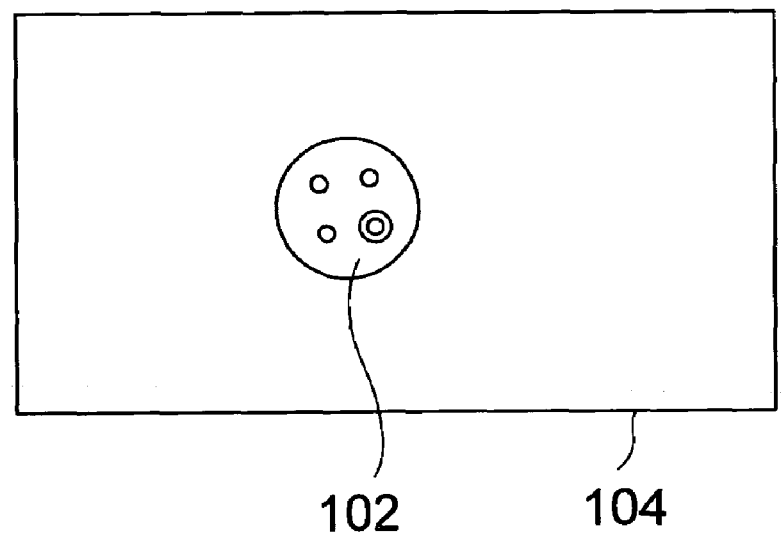
FIG. 6B is a bottom view of FIG. 6A.

FIG. 1A is a cross sectional view of an LD and a base; FIG. 1B is a bottom view of FIG. 1A; FIG. 2A is a cross sectional view of an LD, a base, and a heat dissipation plate used in a first example of the embodiment; FIG. 2B is a bottom view of FIG. 2A; FIG. 3A is a cross sectional view of an LD, a base, and a heat dissipation plate used in a second example of the embodiment; FIG. 3B is a bottom view of FIG. 3A; FIG. 4A is a cross sectional view of the LD, the base, the heat dissipation plate, and an LD plate used in the first example of the embodiment; FIG. 4B is a cross sectional view of the LD, the base, the heat dissipation plate, and an LD plate used in the second example of the embodiment; and FIG. 4C is a bottom view of FIG. 4A or FIG. 4B. An overall view of an optical pickup is the same as that shown in FIG. 5 in which the LD holder 103 is replaced with the heat dissipation plate and, therefore, will be omitted.

An LD (Laser Diode) 10 has a disk-shaped metal base pedestal 10a. The portion of the base pedestal 10a is inserted and fitted into a base 11 as shown in FIG. 1A and FIG. 1B. Next, as shown in FIG. 2A and FIG. 2B, or FIG. 3A and FIG. 3B, a heat dissipation plate 12 is inserted and fitted around the portion of the base pedestal 10a so as to come into contact with the circumferential portion thereof. Then, as shown in FIG. 4A, FIG. 4B, and FIG. 4C, an LD plate 13 is fixed to the base 11 through the heat dissipation plate 12 with screws (refer to FIG. 5).

The LD 10 has a notch 10b in the portion of base pedestal 10a. A protrusion 11a on the base 11 is fitted into the notch 10b, and thereby, the LD 10 is positioned relative to the base 11.

The base 11 is made of resin, for example, PPS resin. The base 11 has protrusions 11a to 11e in its opening portion into which the LD 10 is inserted and fitted. The protrusions 11b to 11h hold the LD 10.

The heat dissipation plate 12 has a doughnut shape made of sheet metal. It is preferable that the heat dissipation plate 12 be made of a material superior in heat dissipating performance. For example, aluminum is used in this embodiment. The doughnut-shaped heat dissipation plate 12 can be obtained by die-cutting a sheet metal through a single cut when the sheet metal is processed.

In the first example of the embodiment shown in FIG. 2A, FIG. 2B, and FIG. 4A, an inner circumferential face of the heat dissipation plate 12 is so processed as to come into contact with the outer circumference of the LD 10 so that heat is dissipated from the LD 10 through each of contact portions 12a to 12c.

In the second example of the embodiment shown in FIG. 3A, FIG. 3B, and FIG. 4B, an inner circumferential face of the heat dissipation plate 12 is formed with contact portions 12d to 12f each of which is bent at 90 degrees so that the bent inner circumferential face comes in contact with the outer circumference of the LD 10 for further improved heat dissipation performance. The contact portions 12d to 12f are inserted into notches 11f to 11h serving as gaps between the base 11 and the LD 10 and come into contact with the outer circumference of the LD 10.

Because the heat dissipation plate 12 is a member for absorbing heat generated by the LD 10 and facilitates the heat to be released, a larger size is desirable. However, the larger it becomes, the bigger the footprint it takes and the bigger the optical pickup itself becomes. For this reason, it is necessary to consider both the heat dissipation performance and the footprint, and find an appropriate size. It is to be noted that there is no specific restriction in the shape of the heat dissipation plate 12, and a shape that offers the largest contact area with the LD 10 is preferable in terms of heat dissipation. As long as the heat dissipation plate 12 maintains contact with the base pedestal 10a, it may be in contact with a bottom surface of the base pedestal 10a.

The LD plate 13 is made of metal and serves to fix the LD 10 and the heat dissipation plate 12 to the base 11. Screws or adhesives may be used for fixing. The LD plate also serves a role in absorbing and releasing heat from the heat dissipation plate 12, because it is made of metal.

As described above, by replacing a conventional LD holder which is produced through metal forming with the heat dissipation plate 12 which is a component made of sheet metal, it is possible to reduce the component cost through easy forming procedure using a smaller amount of inexpensive material. Furthermore, because the contact portions 12a to 12c or the contact portions 12d to 12f of the heat dissipation plate 12 come into contact with the outer circumference of the LD 10, the contact area is made larger. This, combined with using a good heat conductive material, makes it possible to maintain the heat dissipation performance.

The optical pickup of the invention can be used for the requirements in which an LD is fitted to a base made of resin and, therefore, can be incorporated in such optical disk apparatuses as CD, DVD, and various other apparatuses.

What is claimed is:

1. An optical pickup comprising:
    an LD (Laser Diode) device including a housing with a metal base pedestal;
    a base through which the LD device is inserted so as to support the LD device by way of the base pedestal;
    a heat dissipation plate made of sheet metal through which the LD device is inserted and kept in contact with the LD device so as to dissipate heat therefrom; and
    an LD plate for fixing the LD device and the heat dissipation plate to the base,
    wherein the heat dissipation plate has an inner circumferential face that is kept in contact with an outer circumference of the base pedestal of the LD device, and the heat dissipation plate is interposed between the LD plate and the base.

2. The optical pickup of claim 1, wherein the inner circumferential face of the heat dissipation plate is bent perpendicularly so as to surround and be kept in contact with the outer circumference of the base pedestal of the LD device.

3. An optical disk apparatus incorporating the optical pickup of claim 1.

4. The optical pickup of claim 1, wherein the LD plate is made of metal and kept in contact with the heat dissipation plate so as to dissipate heat from the heat dissipation plate.

5. An optical disk apparatus incorporating an optical pickup, the optical pickup comprising:
    an LD (Laser Diode) device including a housing with a metal base pedestal;
    a base through which the LD device is inserted so as to support the LD device by way of the base pedestal;
    a heat dissipation plate made of sheet metal through which the LD device is inserted and kept in contact with the LD device so as to dissipate heat therefrom; and
    an LD plate for fixing the LD device and the heat dissipation plate to the base,
    wherein the heat dissipation plate has a doughnut shape and is interposed between the LD plate and the base, and the inner circumferential face of the heat dissipation plate is bent perpendicularly so as to surround and make contact with the outer circumference of the base pedestal of the LD device.

6. The optical disk apparatus of claim 5, wherein the LD plate is made of metal and kept in contact with the heat dissipation plate so as to dissipate heat from the heat dissipation plate.

* * * * *